United States Patent [19]
Dawson et al.

[11] Patent Number: 5,206,583
[45] Date of Patent: Apr. 27, 1993

[54] LATCH ASSISTED FUSE TESTING FOR CUSTOMIZED INTEGRATED CIRCUITS

[75] Inventors: James W. Dawson, Poughkeepsie; George A. DeLuca, Salt Point; Michael Nicewicz, Hopewell Junction, all of N.Y.

[73] Assignee: International Business Machines Corporation, Armonk, N.Y.

[21] Appl. No.: 747,848

[22] Filed: Aug. 20, 1991

[51] Int. Cl.$^5$ .................................. G01R 31/00
[52] U.S. Cl. .................. 324/158 R; 324/73.1; 437/8
[58] Field of Search ............ 324/158 R, 158 T, 73.1; 29/743, 750, 753; 371/23, 22.5, 15.1

[56] References Cited

U.S. PATENT DOCUMENTS

| | | | |
|---|---|---|---|
| 3,707,767 | 1/1973 | Quevrin | 437/8 |
| 3,839,781 | 10/1974 | Russell | 437/8 |
| 3,879,839 | 4/1975 | Logue | 437/8 |
| 3,940,740 | 2/1976 | Coontz | 437/8 |
| 4,288,911 | 9/1981 | Ports | 437/8 |
| 4,586,242 | 5/1986 | Harrison | 437/8 |
| 4,820,222 | 4/1989 | Holmberg | 437/8 |
| 4,852,093 | 7/1989 | Kolppe | 371/23 |
| 4,864,165 | 9/1989 | Hoberman et al. | 324/73.1 |
| 4,961,053 | 10/1990 | Krug | 437/8 |
| 5,068,603 | 11/1991 | Mahoney | 324/158 R |

Primary Examiner—Ernest F. Karlsen
Assistant Examiner—William J. Burns
Attorney, Agent, or Firm—Whitham & Marhoefer

[57] ABSTRACT

On-chip circuitry facilitates fuse testing in customized integrated circuits. The circuitry has specific application in testing fuse redundancy high end memories. A latch assisted fuse testing (LAFT) methodology employs an on-chip latch stack which can be used in place of the fuses. The latches in the stack are programmable and can perform the same function as the fuses during chip operation. This allows testing or experimentation to be performed nondestructively, without blowing any fuses. In one particular application of the invention, memory arrays with redundant blocks on a chip are provided with the on-chip latch stack. After the tests based on previously generated error data are performed using the latch stack, fuses are blown to repair the memory array by replacing defective memory blocks with redundant blocks.

8 Claims, 6 Drawing Sheets

LATCH ASSISTED FUSE TESTING FOR CUSTOMIZED INTEGRATED CIRCUITS

BACKGROUND OF THE INVENTION

1. Field of the Invention

The present invention generally relates to testing of integrated circuits (ICs) as part of the manufacturing process and, more particularly, to on-chip circuitry which facilitates fuse testing in customized integrated circuits. The invention has specific application in testing fuse redundancy high end memories.

2. Description of the Prior Art

Redundancy in integrated circuit memories is part of current wafer and chip manufacturing strategy to improve yield. The practice is to blow fuses which allow extra memory cells to be used in place of cells that are non-functional. Fuses have been used in lower performance products where the method of blowing the fuses is with a laser. This is not practical in high performance products and, therefore, the preferred method of blowing the fuses is by means of high currents.

The simplification of the fuse blow procedure afforded by using high currents is but one part of the cost of the manufacturing equation. The need for improving test methodologies is also extremely important in the manufacturing environment. Test costs have been driven higher and higher as devices become more complex. The goal is to maintain or increase the quality of the test while minimizing the cost of the test and decreasing product losses resulting from poor quality as determined by the test. It is not an easy task to achieve these conflicting requirements in the high end product environment when performance and cost are the key ingredients to remain competitive.

The fuse blow procedure, combined with current test apparatus, does have a serious drawback. Specifically, once the fuses have been blown, the chip has been permanently altered. The problem is that with current test apparatus, a "false fail" pattern may develop leading to the blowing of fuses for chips which actually do not have defective blocks. If the number of blocks indicated as "failed" by the test apparatus exceeds the number of fuses available to correct for the "false fails", fuses will be blown until the number of blocks needing correction exceeds the number of fuses resulting in a rejection of the chip. Thus, chips which may in fact be good or correctable will be rejected until the "false fail" pattern or syndrome is detected and corrected.

SUMMARY OF THE INVENTION

It is therefore an object of the present invention to provide an improved fuse testing methodology which greatly simplifies testing equipment and software requirements thereby lowering cost and improving quality of the product.

It is another object of the invention to provide a testing procedure which allows chips previously tested and rejected to be re-tested after a "false fail" pattern or syndrome is detected and corrected It is a further object of the invention to provide on-chip latch stacks that allow testing of a chip to be performed nondestructively, without blowing any fuses.

According to the invention, a latch assisted fuse testing (LAFT) methodology is provided which utilizes an on-chip latch stack in place of the fuses during testing. The latches in the stack are programmable and can perform the same function as the fuses during chip operation. Hence, testing or experimentation with the chip can be performed nondestructively, without blowing any fuses. Due to high performance equipment (250 Mhz) constraints, software complexity, and logistical problems, the on-chip circuitry simplifies the testing methodology.

In one particular application of the invention, memory arrays with redundant blocks on a chip are provided with the on-chip latch stack. After the tests are performed using the latch stack, fuses are blown to customize the memory array in order for defective memory blocks to be replaced with redundant blocks.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
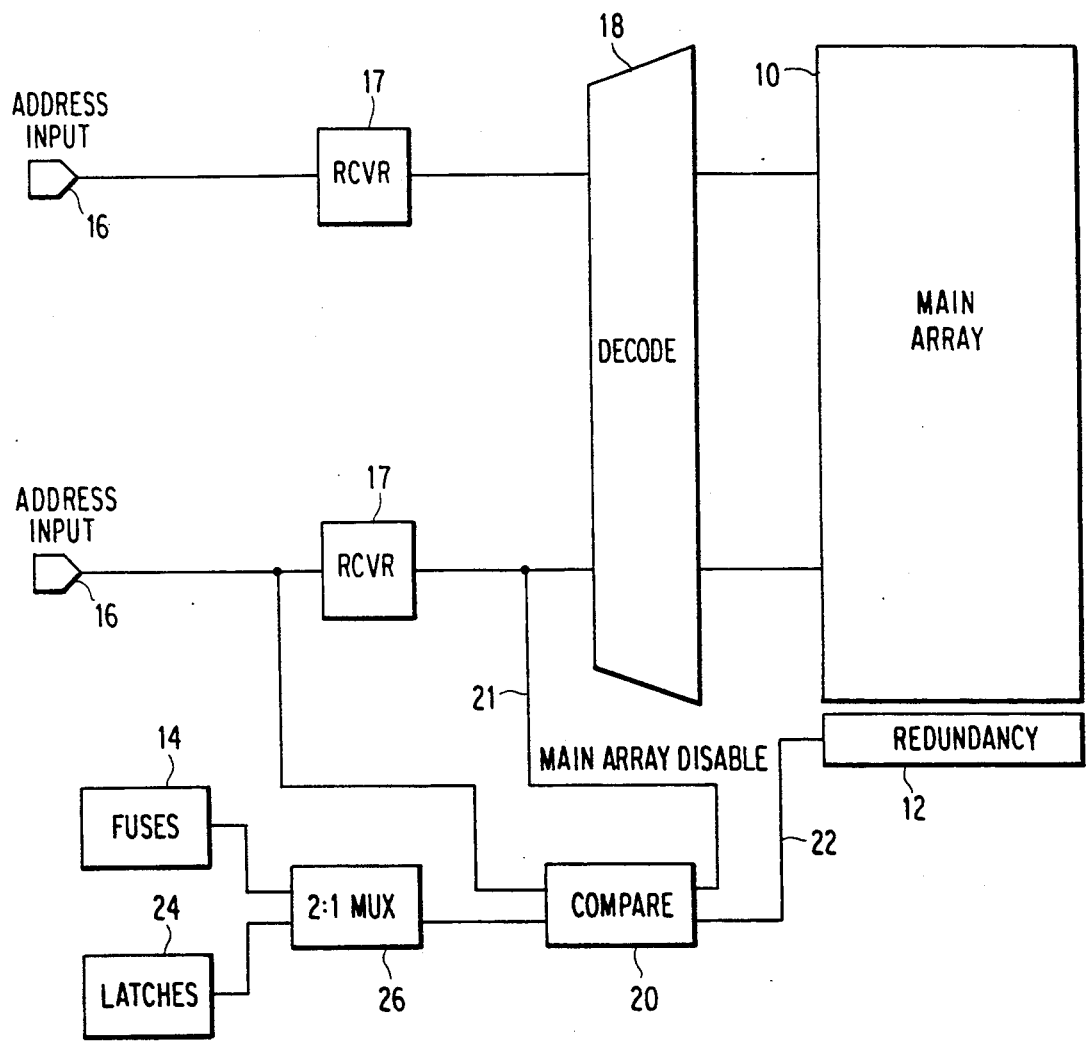
FIG. 1 is a block diagram showing the on-chip architecture of a memory array integrated circuit employing the latch stack according to the invention.

Referring now to the drawings, and more particularly to FIG. 1, there is shown the main array 10 on a wafer or chip (not shown) which includes an array of integrated circuit devices. In a preferred embodiment, the integrated circuit devices are memory cells; however, it is to be understood that the invention is not limited to the manufacture and testing of memory arrays and may be applied to the manufacture and testing of other integrated circuit devices having an array structure such as, for example, programmable logic arrays (PLAs). Also fabricated on the chip are a number of redundant integrated circuit devices 12 (e.g., memory cells) which can be selectively substituted for defective elements of the main array 10 based upon alternating current (AC) test data.

Typically, the main array 10 and the redundant circuits 12 are organized in blocks. Selection of a redundant integrated circuit block to substitute for a block in the main array 10 is accomplished by blowing fuses 14 on the wafer or chip. An input address on terminals 16 is supplied via receivers 17 to a decoder 18. The decoder 18 generates the required row and column select signals according to input address in a well-known manner for the array 10. The input address is also supplied to the compare circuit 20 which compares the address on terminals 16 with an address or addresses represented by blown fuses 14. If a compare is detected, the main array is disabled by the output of compare circuit 20 on line 21 and, instead, the output on line 22 selects the redundant block 12 to be substituted for the defective block corresponding to that address.

Blowing the fuses 14 "customizes" the chip such that only integrated circuit devices which have tested "good" are included for operation with the array 10. By fabricating redundant elements 12 in the chip and selectively substituting those elements into the array 10 as needed, the yield of acceptable chips is increased.

Customizing the chip by fuse blowing to select redundant memory devices is well known in the art. In the prior art when memory arrays are customized, error data must be collected by a test apparatus which represents all the repairable bad cells in the memory under test. Typically, the amount of error data is large (e.g., 300K to 500K bytes/assuming 75K to 125K failed cycles of test). The error data is then processed, converted to failing addresses and compressed to eliminate duplication. Finally, the fuses are blown by either laser or sending high current to the appropriate fuses.

The time associated with this procedure is unacceptable on a chip-by-chip basis to achieve the throughput required for competitive production of the chips. Moreover, blowing fuses without knowing if there are any test system problems may jeopardize entire batches of chips. For example, the test system may develop a "false fail" pattern or syndrome generating incorrect error data. The error data, if incorrect, will result in a large number of chips having fuses blown and then being rejected when, in fact, the chips were either good or correctable.

The present invention is primarily directed to a testing methodology which allows quicker and more reliable identification of defective elements in an array which is repairable by fuse blowing. With reference back to FIG. 1, the invention provides programmable on-chip latches 24 connected in parallel with the fuses 14. The latches 24 are arranged in a stack and can simulate the function of the fuses 14 during chip operation and test. A multiplexer 26 is used to selectively direct output from the fuses 14 or latches 24 to the compare circuit 20. Thus, the output from the fuses 14 or latches 24 may be selectively compared with the address input on terminals 16.

According to the latch assisted fuse testing (LAFT) methodology of the invention, the latches 24 are programmably set with the pattern of a failed address as determined by the test data previously generated for the chip. The output of the latches 24 is selected by the multiplexer 26 to be compared with addresses input on terminals 16. If there are sufficient fuses to correct for the errors detected, the fuses will be blown at the conclusion of the test and the chip accepted as "good". On the other hand, if in the course of simulation of the "failed" address patterns by the latches 24 it develops that there are insufficient latches to correct for the errors detected, the chip is rejected as "failed" without blowing any fuses. Now, should a "false fail" syndrome be detected in the error data for a batch of rejected chips, they can be retested and those which can be corrected can be salvaged.

Figure 2:
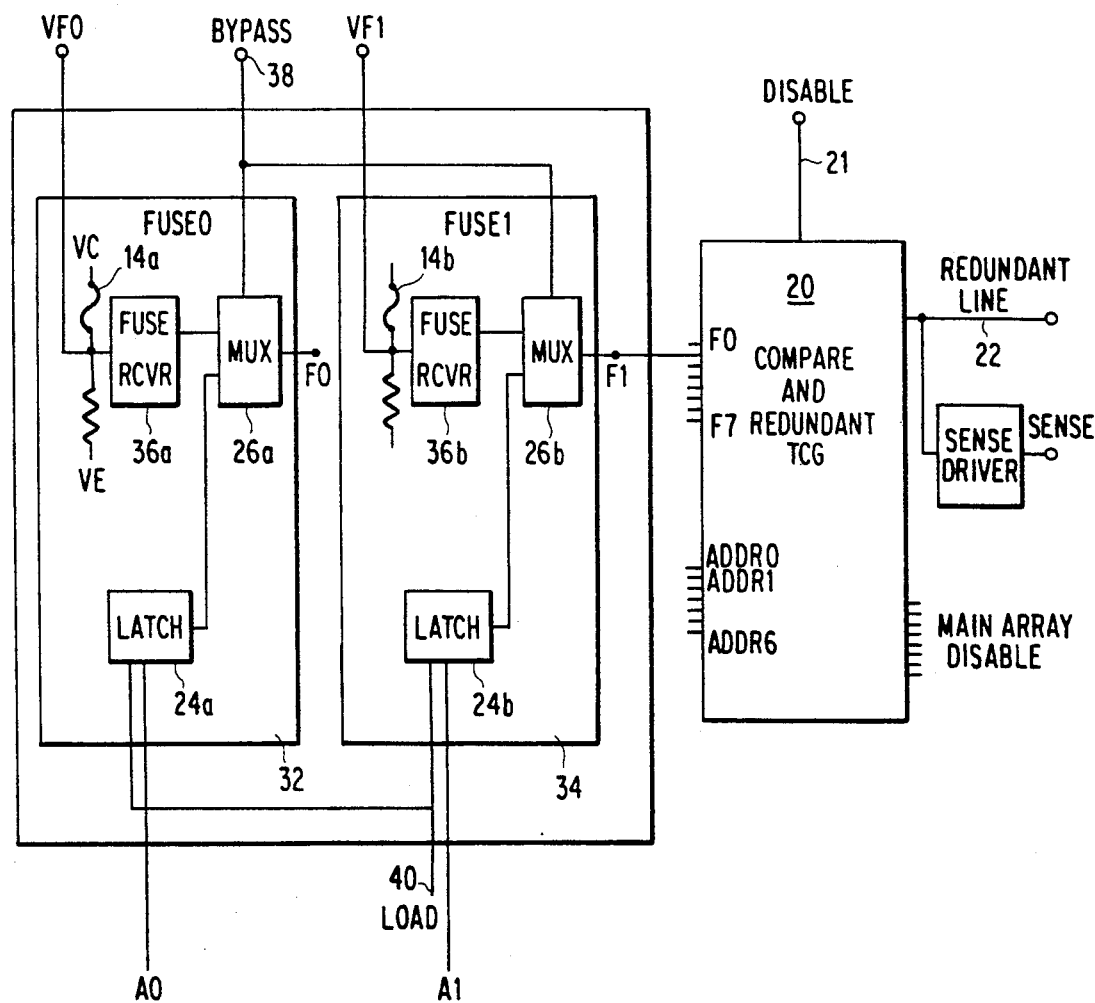
FIG. 2 is a block diagram showing in more detail the circuits used in the memory array of FIG. 1 to implement the latch assisted fuse test.

FIG. 2 shows a block diagram of the circuits used to implement the latch assisted fuse test of the present invention. In FIG. 2, fuses 14a and 14b, latches 24a and 24b, and multiplexers 26a and 26b, associated with blocks 32 and 34, respectively, correspond to fuses 14, latches 24, and multiplexer 26 of FIG. 1. It should be understood that several additional such blocks with associated fuses and latches are provided in the practice of the invention and would be connected in the same manner as shown in FIG. 2.

The fuse receivers 36a and 36b sense the state of the fuses 14a and 14b, respectively. The latches 24a and 24b are connected in parallel with the fuses 14a and 14b. The multiplexers 26a and 26b allow the latch data to be used in place of the fuse data. The BYPASS control line 38 is connected to each multiplexer 26a and 26b and is toggled to select either the fuse or the latch outputs. Data from the multiplexers 26a or 26b are passed to the compare circuit 20.

The compare circuit 20 is conventional and has a plurality of pins F0–F7 which correspond to each of the memory block-fuse-latch-multiplexer groups which are identified as FUSE0, FUSE1, etc. At the compare circuit 20, the fuse or latch data from the multiplexers 26a and 26b is compared to the chip address inputs ADDR0, ADDR1, etc. If the fuse or latch data matches the chip address inputs, then the array 10 is disabled by a signal on line 21 and redundant cells are selected in place of normal cells in response to the signal on line 22.

The latches 24a and 24b are loaded when the LOAD control line 40 is toggled high. The programmable data input to the latches 24a and 24b is designated as inputs A0 and A1, but it will be understood that the number of inputs is equal to the number of address bits. No additional input/outputs (I/Os) are required than for fused chips without the latch stack according to the invention.

Figure 3:
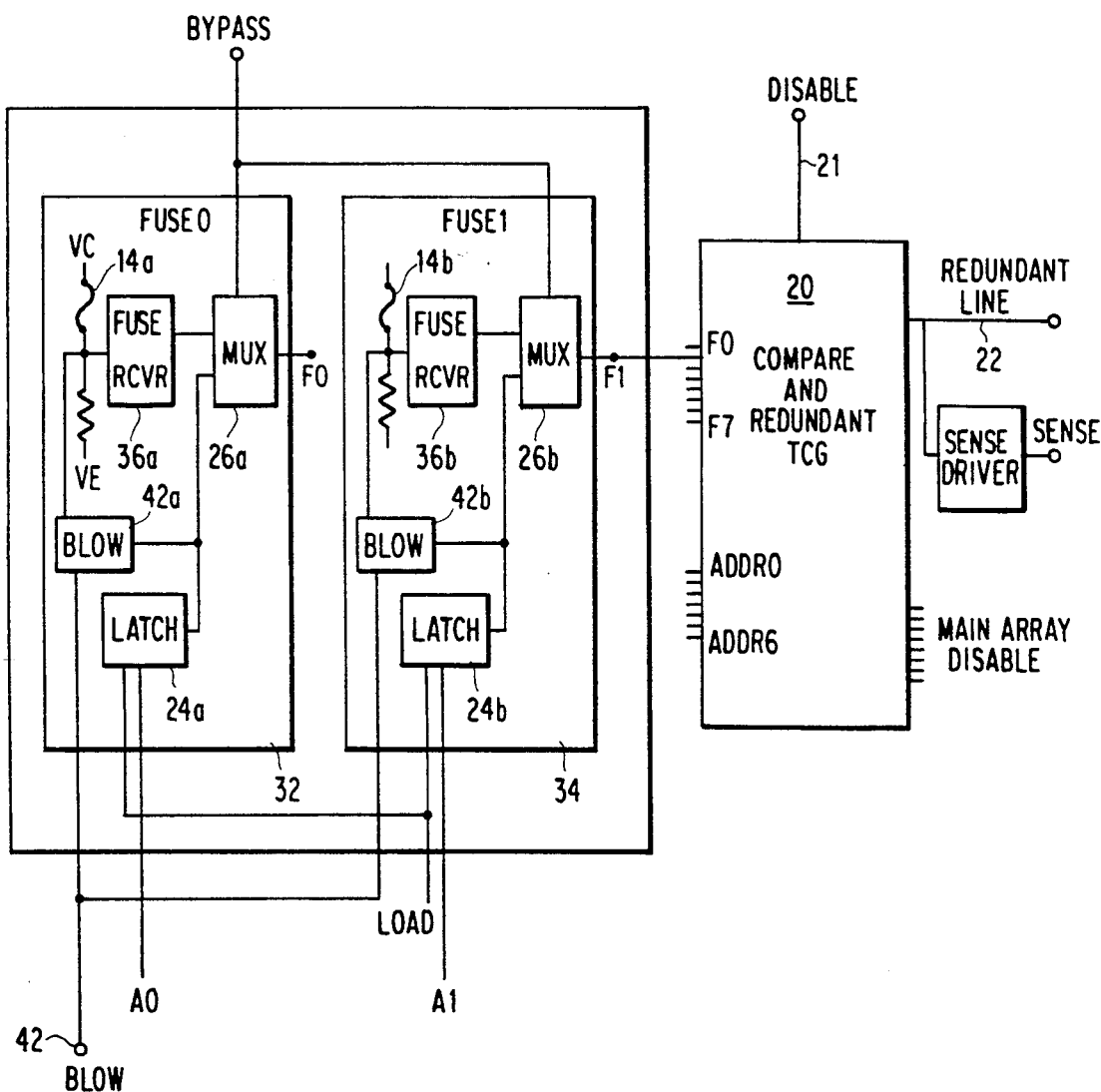
FIG. 3 is a block diagram showing a modification to the circuits of FIG. 2 to permit the fuses to be blown directly by the latches.

FIGS. 2 and 3 show alternative designs for blowing the fuses 14a and 14b. In FIG. 2, the fuses 14a and 14b are blown by an external source applying a high current to lines VF0 and VF1, respectively. In FIG. 3, on-chip blow circuits 42a and 42b are provided and work in conjunction with latches 24a and 24b, respectively. High current from the BLOW line is selectively applied to the fuses 14a and/or 14b under the direction of the on-chip blow circuits 42a and 42b.

The testing methodology includes an iterative process for determining the fuses which should be blown to produce a "good" chip. After a fail is detected, as indicated by the error data for the chip, the latches 24 are programmed to simulate the fuses to be blown. The test is repeated N times, where N is the number of allowed repairs, or until the chip is found to be "good". A "good" chip is identified during testing when the latch stack output to the comparator, which corresponds to a particular configuration of blown and non-blown fuses for selectively disabling certain memory blocks on the chip, will allow the chip to pass certain AC tests. Having several AC tests result in a positive response provides a quality level of assurance that all test system parameters are functioning properly and assures that the chip can be repaired.

In the embodiment of the invention shown in FIG. 3, the redundant memory blocks 12 which can be substituted into the main array 10 in place of a defective memory block are identified. The address data in the latches 24a and 24b is used to identify and direct high current to the particular fuses which need to be blown. Fuses are then blown and the remaining operational tests for the chip are performed. As in the FIG. 2 embodiment, if the chip is not repairable, i.e., no configuration of blown and non-blown fuses is identified from the latch stack output as resulting in a "good" chip, the chip is discarded, but without blowing any fuses.

Figure 4:
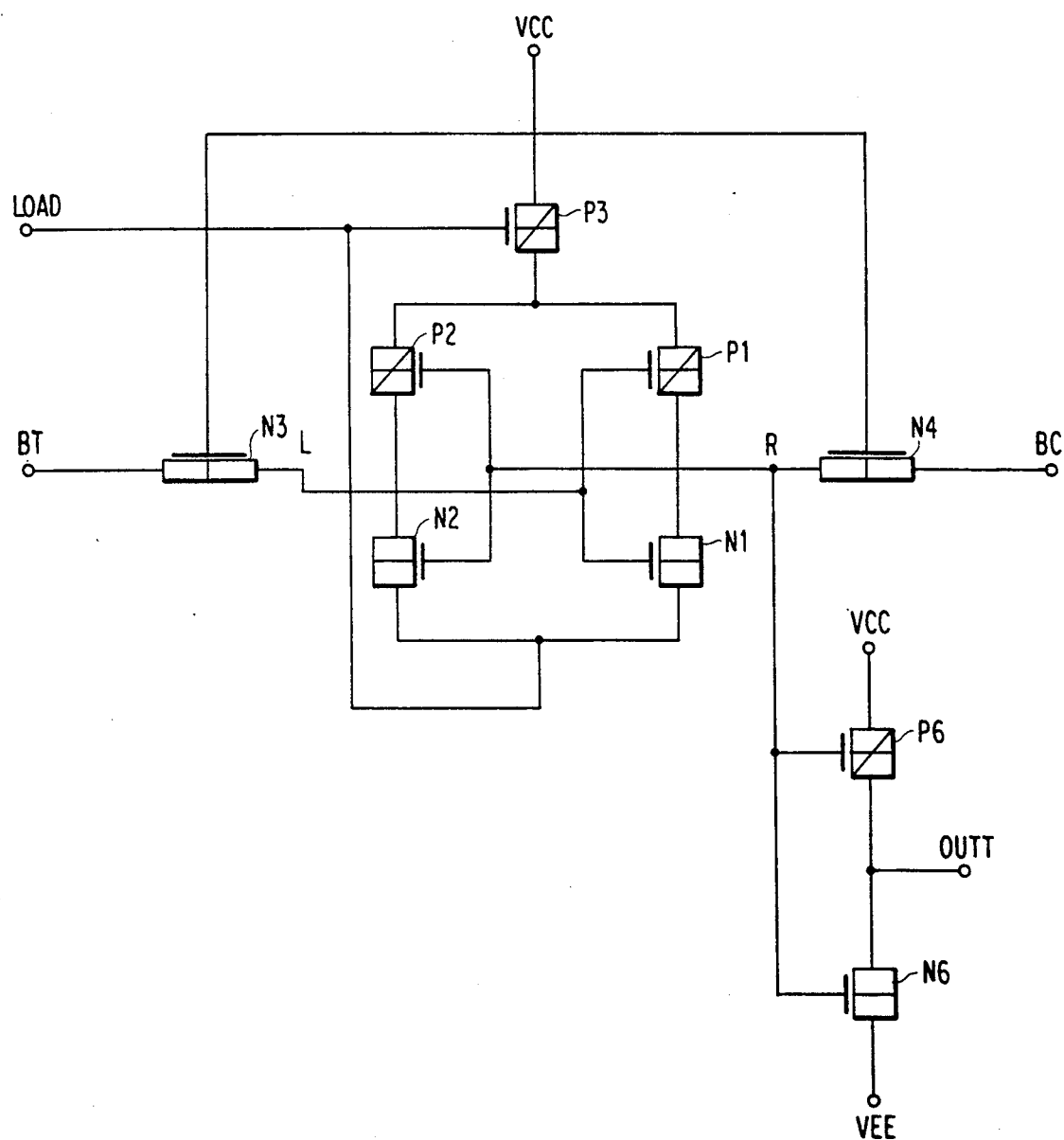
FIG. 4 is a schematic diagram showing a preferred implementation of a latch used in the latch stack.

FIG. 4 shows an example of a latch circuit which may be used in the practice of the invention. This circuit comprises a pair of complementary metal oxide semiconductor (CMOS) cross-coupled inverters P1,N1 and P2,N2. Specifically, a P-channel field effect transistor (FET) P1 is connected in series with an N-channel FET N1 to form the first invertor, and P-channel FET P2 is connected in series with an N-channel FET N2 to form the second invertor. The gates of P1 and N1 are connected in common with the drains of P2 and N2, and the gates of P2 and N2 are connected in common with the drains of P1 and N1. The sources of P1 and P2 are connected in common to a source of voltage Vcc via a P-channel FET P3. The gate of P3 and the sources of N1 and N2 are connected in common with the LOAD control line. A signal on the LOAD control line enables the latch for loading.

When enabled, a signal at terminal BT is coupled via N-channel FET N3 to the common connection of the gates of P1 and N1. The complement of the signal at terminal BT is applied to terminal BC and coupled via N-channel FET N4 to the gates of P2 and N2. The complementary signals BT and BC are used to set the latch. The output of the latch is taken from the drains of P1 and N1 via the invertor/driver comprised of P-channel FET P6 and N-channel FET N6.

Figure 5:
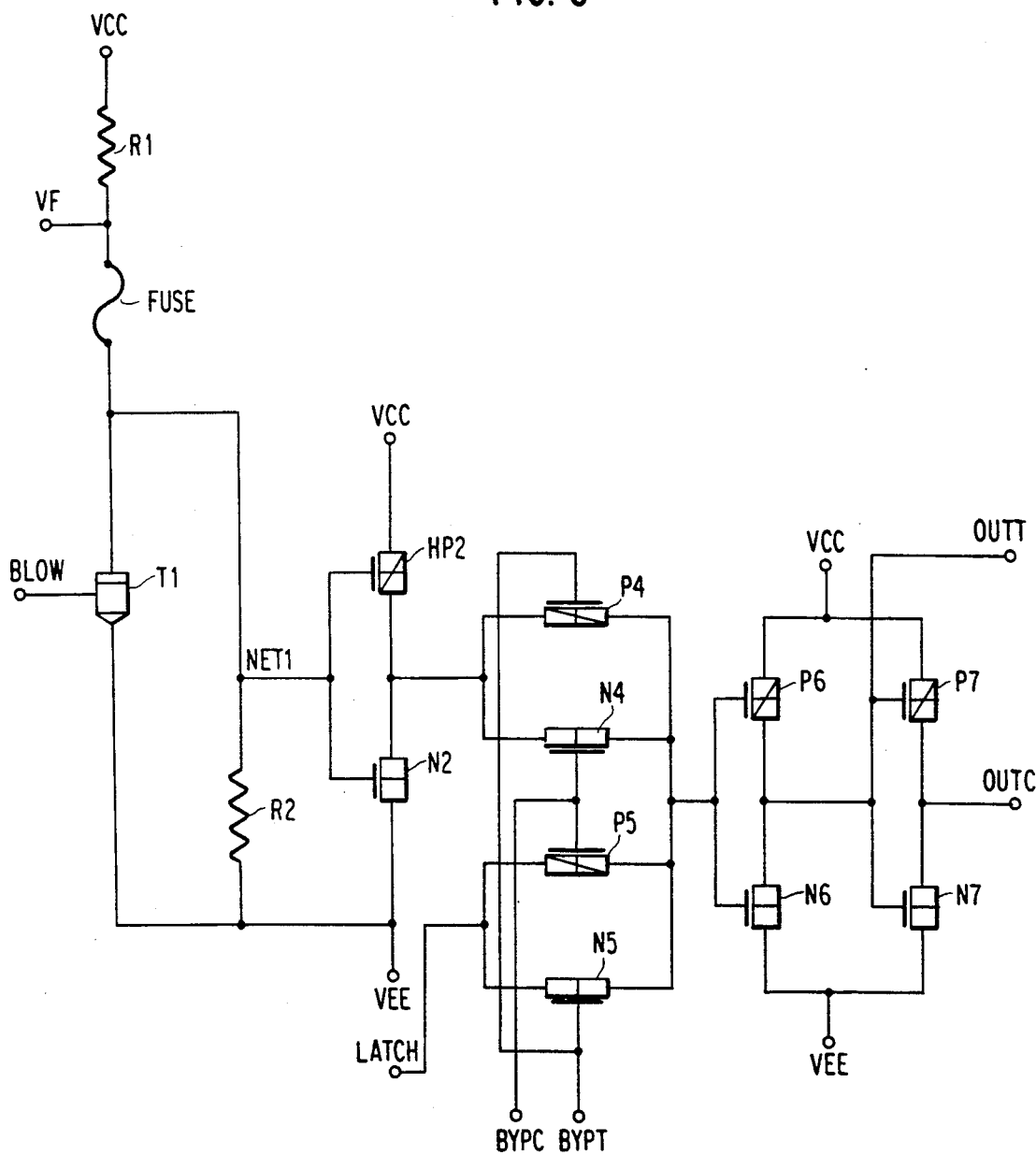
FIG. 5 is a schematic diagram showing a preferred implementation of the fuse receiver and multiplexer used in the embodiments shown in FIGS. 2 and 3.

FIG. 5 shows the circuitry of the fuse receiver 36 and the multiplexer 18. The fuse 14 is connected to the voltage source Vcc via a resistor R1 and to the return voltage source Vee via a resistor R2. The resistor R1 and the fuse and the resistor R2 constitute a voltage divider having an output at junction NET1 between fuse 14 and resistor R2. The voltage divider junction NET1 is connected to the input of a CMOS invertor comprising P-channel FET P2 and N-channel FET N2. The output of the invertor is the fuse, F, input to the multiplexer 26. The other input to the multiplexer 26 is the output of the latch shown in FIG. 4.

The multiplexer 26 comprises CMOS gates controlled by the true and complement of the BYPASS control signal, here denoted BYPT and BYPC, respectively. More specifically, the fuse input, F, is applied to the source of P-channel FET P4 and the drain of N-channel FET N4, while the latch input is applied to the source of P-channel FET P5 and the drain of N-channel FET N5. The BYPT control line is connected in common with the gates of FETs N5 and P4, and the BYPC control line is connected in common with the gates of FETs P5 and N4. Thus, when the BYPT signal is low, FET N5 conducts and FET P4 is cut off. Since BYPC is, by definition, the complement of BYPT, the BYPC signal will be high so that FET P5 conducts but FET N4 is cut off.

The output of the multiplexer 26 is taken in common from each of the FETs P4,N4 and P5,N5 and applied to cascaded invertor/drivers composed of FETs P6,N6 and P7,N7. The output of the first invertor/driver P6,N6 is the true output OUTT, while the output of the second invertor/driver P7,N7 is the complement output OUTC.

For the embodiment shown in FIG. 3, a bipolar NPN transistor T1 is connected in parallel with resistor R2. A blow signal applied to the base of transistor T1 effectively shorts out resistor R2 causing a large current to flow in fuse 14, blowing it. The blow signal applied to the base of transistor T1 is generated by the circuit shown in FIG. 6. This circuit is basically an FET AND gate of well-known design. It comprises a pair of P-channel FETs P1 and P2 connected in parallel and a pair of N-channel FETs N1 and N2 connected in series.

The sources of P1 and P2 are connected in common to the voltage source Vcc. The source of N2 is connected to the return voltage source Vee. The gates of P1 and N2 are connected in common to input terminal A, and the gates of P2 and N1 are connected in common to input terminal B.

Figure 6:
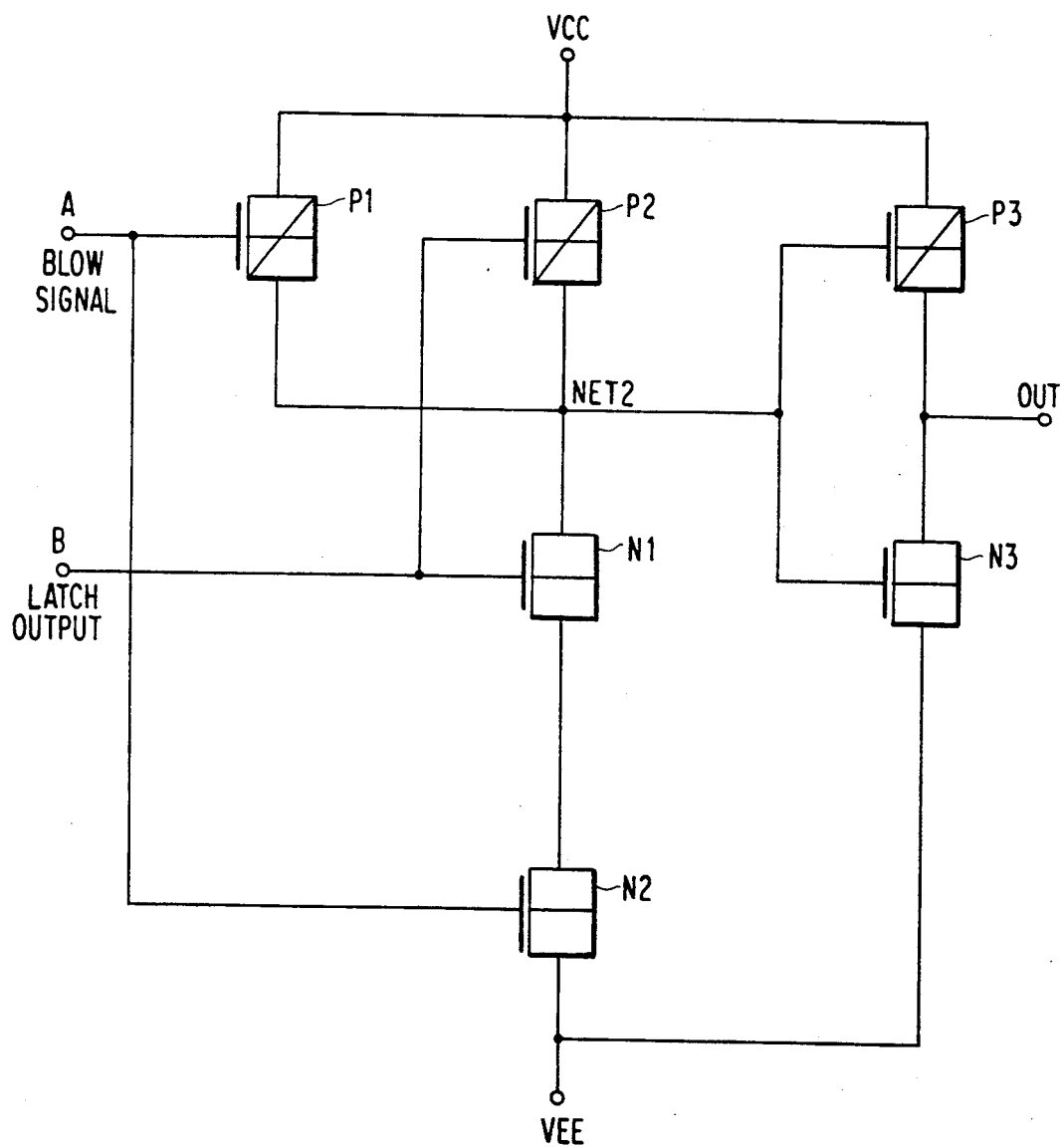
FIG. 6 is a schematic diagram showing a preferred implementation of a blow circuit used in the FIG. 3 embodiment.

The blow signal on terminal 42 shown in FIG. 3 is applied to terminal A of the AND gate shown in FIG. 6. The latch output is applied to terminal B. Only when there are signals simultaneously on terminals A and B is an output generated. The output is taken from the junction of the drains of P1, P2 and N1, denoted as NET2. This output is applied to the invertor/driver composed of P3,N3 which generates the blow signal applied to the base of transistor T1 in FIG. 5.

While the circuitry of FIGS. 4, 5 and 6 is used in the implementation of the preferred embodiments of the invention shown in FIGS. 2 and 3, this circuitry is for the most part conventional. Other circuits can be substituted for the latches, multiplexers and blow circuits in the practice of the invention. Thus, although the invention has been described in terms of two preferred embodiments where an on-chip latch stack is used in testing integrated circuit wafers or chips in order for active, redundant memory cells to be selected for substitution into a memory array with defective memory cells being removed by selective fuse blowing, those skilled in the art will recognize that the invention can be practiced with modification within the spirit and scope of the appended claims. For example, those integrated circuit devices especially benefiting from the methodology of the invention are array structures, such as memory arrays, but the invention includes other types of array structures, such as programmable logic arrays (PLAs).

Having thus described our invention, what we claim as new and desire to secure by Letters Patent is as follows:

1. A latch assisted fuse testing method for testing integrated circuit chips during the process of manufacturing said chips, said chips being fabricated with an array structure characterized by a main array structure and redundant blocks wherein redundant blocks can be substituted for blocks in said main array structure by the selective blowing of fuses in a fuse array, said testing method comprising the steps of:
   providing an on-chip latch stack comprising a plurality of programmable latches paralleling the fuses in said fuse array;
   providing an on-chip multiplexer means responsive to a bypass signal for selecting outputs from said fuses or said latches;
   programming said latches to simulate a pattern of blown fuses according to previously generated error data;
   selecting outputs from said latches to simulate a pattern of blown and unblown fuses;
   comparing outputs provided by said multiplexer means with a predetermined test input to either allow the selection of a block within said main array structure or a redundant block; and
   blowing fuses according to the simulated pattern in only those chips which are tested as repairable during production manufacture of the chips.

2. The latch assisted fuse testing method recited in claim 6 wherein the step of blowing fuses is performed by supplying a current to blow those fuses according to the programming of said latches.

3. The latch assisted fuse testing method recited in claim 2 wherein the step of supplying a current to blow fuses is performed by providing an on-chip plurality of on-chip blow circuits responsive to said latches for supplying said current to blow those fuses according to the programming of said latches.

4. An integrated circuit chip comprising:

an array structure including a main array of blocks and one or more redundant blocks which may be substituted for blocks in said main array;

a fuse array comprising a plurality of fuses;

an on-chip latch stack comprising a plurality of programmable latches paralleling the fuses in said fuse array;

means for programming said latches to simulate a pattern of blown fuses according to previously generated error data;

multiplexer means responsive to a bypass signal for selecting outputs from said fuses or said latches;

comparator means for comparing outputs provided by said multiplexer means with a predetermined test input to either allow the selection of a block within said main array structure or a redundant block; and means for selectively blowing fuses in only those chips which are tested as repairable during production manufacture of said chip.

5. The latch assisted fuse testing circuitry recited in claim 4 wherein said means for selectively blowing fuses comprises off-chip means for supplying a current to blow those fuses according to the programming of said latches.

6. The latch assisted fuse testing circuitry recited in claim 4, wherein said means for selectively blowing fuses comprises:

a plurality of on-chip blow circuits responsive to said latches for supplying a current to blow those fuses according to the programming of said latches; and means supplying said current to said plurality of on-chip blow circuits.

7. The latch assisted fuse testing circuitry recited in claim 4 wherein said array structure comprises a memory array.

8. The latch assisted fuse testing circuitry recited in claim 4 wherein said array structure is a programmable logic array.

* * * * *